United States Patent
Song

(10) Patent No.: US 7,622,320 B2
(45) Date of Patent: Nov. 24, 2009

(54) CMOS IMAGE SENSOR AND FABRICATING METHOD THEREOF

(75) Inventor: Jun Woo Song, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 42 days.

(21) Appl. No.: 11/926,028

(22) Filed: Oct. 28, 2007

(65) Prior Publication Data

US 2008/0149974 A1    Jun. 26, 2008

(30) Foreign Application Priority Data

Dec. 22, 2006    (KR) .................... 10-2006-0133128

(51) Int. Cl.
*H01L 21/00* (2006.01)
(52) U.S. Cl. .......................................... 438/57; 438/66
(58) Field of Classification Search .................... 438/57, 438/66
See application file for complete search history.

(56) References Cited

U.S. PATENT DOCUMENTS 5,448,097 A * 9/1995 Mizushima et al. ......... 257/435
5,654,565 A * 8/1997 Hokari ...................... 257/222
2006/0197169 A1    9/2006 Cole
2008/0173965 A1 * 7/2008 Cole ........................... 257/435

FOREIGN PATENT DOCUMENTS

CN    1322014    11/2001

* cited by examiner

*Primary Examiner*—Long Pham
(74) *Attorney, Agent, or Firm*—Workman Nydegger

(57) ABSTRACT

A CMOS image sensor and method of fabricating the same are disclosed. The method comprises forming a plurality of polysilicon patterns on a silicon epitaxial layer which correspond to a plurality of photodiodes in a dummy pixel area, depositing a metal with a high melting point metal on the plurality of polysilicon patterns using a photoresist in an etching process, forming a silicide layer of the high melting point metal by removing the photoresist and then performing an ashing and rapid annealing process, sequentially forming a device protecting layer and a planarization layer on the silicon epitaxial layer and silicide layer, and forming a microlens on the planarization layer which corresponds to the silicide layer.

5 Claims, 2 Drawing Sheets

-- PRIOR ART --

-- PRIOR ART --

CMOS IMAGE SENSOR AND FABRICATING METHOD THEREOF

CROSS-REFERENCES AND RELATED APPLICATIONS

This application claims the benefit of the Korean Patent Application No. P2006-0133128, filed on Dec. 22, 2006, which is hereby incorporated by reference in its entirety.

BACKGROUND OF THE INVENTION

1. Field of the Invention

The present invention relates to a CMOS image sensor. More particularly, to a CMOS image sensor and method of fabricating a CMOS image sensor using a reduced number of processes.

2. Discussion of the Related Art

Image sensors are typically used for converting an optical image to an electric signal. The image sensors currently used in the art are generally categorized as either CMOS (complementary metal-oxide-silicon) image sensors or CCS (charge coupled device) image sensors. The CCD image sensor has superior photosensitivity and noise characteristics compared to the CMOS image sensor, but is difficult to incorporate in highly integrated systems has a comparatively high power consumption.

On the contrary, the CMOS image sensor uses simpler processes than the CCD image sensor, making it more suitable for the density of highly integrated systems. Additionally, the CMOS image sensor has comparatively low power consumption.

As the technology of manufacturing semiconductor devices has become more highly developed, many efforts have been made to research and develop the photosensitivity and noise characteristics of the CMOS image sensor.

Generally, each pixel of a CMOS image sensor consists of photodiodes capable of receiving light and CMOS devices capable of controlling the received light. Within the photodiodes, electron-hole pairs are generated which correspond to the wavelength and intensity of red, green and blue rays detected using a color filter. The out signals vary according to the quantity of the generated electrons, making it possible to capture an image.

A CMOS image sensor is shown in FIGS. 1A and 1B, and consists of a main pixel area 1 comprising a photocharge converting unit such as a photodiode 21, a dummy pixel area 2 provided outside the main pixel area 1, and a peripheral circuit area 3 for detecting signals detected by the pixel area 1 and the dummy pixel area 2. The peripheral circuit area 3 is formed so as to surround the main pixel area 1 and the dummy pixel area 2.

In the CMOS image sensor manufacturing process of the current art an oxide layer is coated on the surface of the sensor in order to form a device protecting layer 22 in order to protect a device from moisture or external physical shock. Additionally, a dark shield layer 23 is formed on the device protecting layer 22 corresponding to the photodiode 21 in order to shield the dummy pixel area 2 from light.

Subsequently, a planarization layer 24 is formed with its surface being planarized. Then, a microlens 25 is formed on the planarization layer 24.

Thus, in the manufacturing processes currently used in the art for forming the dummy pixel area 2 and main pixel area 1, the dummy pixel area 2 forming process requires an additional process in order to form the dark shield layer 23 to shield the area from light.

BRIEF SUMMARY OF THE INVENTION

Accordingly, the present invention is directed to a CMOS image sensor and method of fabricating a CMOS image sensor that substantially obviates one or more problems, limitations, or disadvantages of the related art.

An object of the present invention is to provide a method of fabricating a CMOS image sensor, wherein process steps can be reduced by eliminating the process of forming a dark shield layer in a dummy pixel area.

Another object of the present invention is a CMOS image sensor wherein the light-shielding function is carried out using a polysilicon pattern and a silicide layer in a main pixel area, without requiring a dark shield layer in the dummy pixel area.

Additional advantages, objects, and features of the invention will be set forth in part in the description which follows and will become apparent to those having ordinary skill in the art upon examination of the following or may be learned from practicing the invention. The objectives and other advantages of the invention may be realized and attained by the structure particularly pointed out in the written description, claims, and in the appended drawings.

To achieve these objects and other advantages, one aspect of the invention is a method of fabricating a CMOS image sensor comprising forming a plurality of polysilicon patterns on a silicon epitaxial layer, the polysilicon patterns corresponding to the location of a plurality of photodiodes in a dummy pixel area, depositing a metal with a high melting point on the polysilicon patterns using a photoresist in an etching process, forming a silicide layer from the material with a high melting point by removing the photoresist pattern using an ashing process and performing a rapid annealing process, forming a device protecting layer and a planarization layer on the silicon epitaxial layer and silicide layer, and forming a microlens on the planarization layer which corresponds to the location of the silicide layer.

Another aspect of the present invention is a CMOS image sensor which includes a plurality of polysilicon patterns on a silicon epitaxial layer which correspond to the locations of a plurality of photodiodes in a dummy pixel area, a silicide layer of a metal with a high melting point formed on each of the polysilicon patterns, a device protecting layer and a planarization layer sequentially disposed on the silicon epitaxial layer and silicide layer, and a plurality of microlenses on the planarization layer which correspond to the location of the silicide layer.

It is to be understood that both the foregoing general description and the following detailed description that the embodiments of the present invention described herein are exemplary and explanatory and are intended to provide further explanation of the invention as claimed.

BRIEF DESCRIPTION OF THE DRAWINGS

The accompanying drawings are included in order to provide a further understanding of the invention and are incorporated in and constitute a part of this application. The drawings illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A method of fabricating a CMOS image sensor according to one embodiment of the present invention includes forming a polysilicon pattern of a gate electrode in a main pixel area, replacing of the process of forming a dark shield layer for shielding incoming light from a dummy pixel area of the CMOS image sensor that is currently used in the current art. Thus, the present invention proposes a CMOS image sensor wherein a gate electrode is formed in the main pixel area while the polysilicon pattern and silicide layer are formed in a dummy area.

In a method of fabricating a CMOS image sensor according to one embodiment of the present invention, a polysilicon pattern 221 is used in order to form a gate electrode in the main pixel area. At the same time, the polysilicon pattern 221 is formed on a silicon epitaxial layer 200 in a dummy pixel area. The dummy pixel area includes a photodiode 210, such as a red, green, or blue sensing photodiode, and the polysilicon pattern 221 is formed so as to cover the photodiodes 210.

In particular, the process of forming a polysilicon pattern in the dummy pixel area using a process that is similar to the process of forming a gate electrode in a main pixel area. More specifically, the polysilicon is deposited in a prescribed CVD chamber at a low temperature using silane gas and then forming into a polysilicon layer using a chemical mechanical polishing or "CMP" process.

Figure 1A:
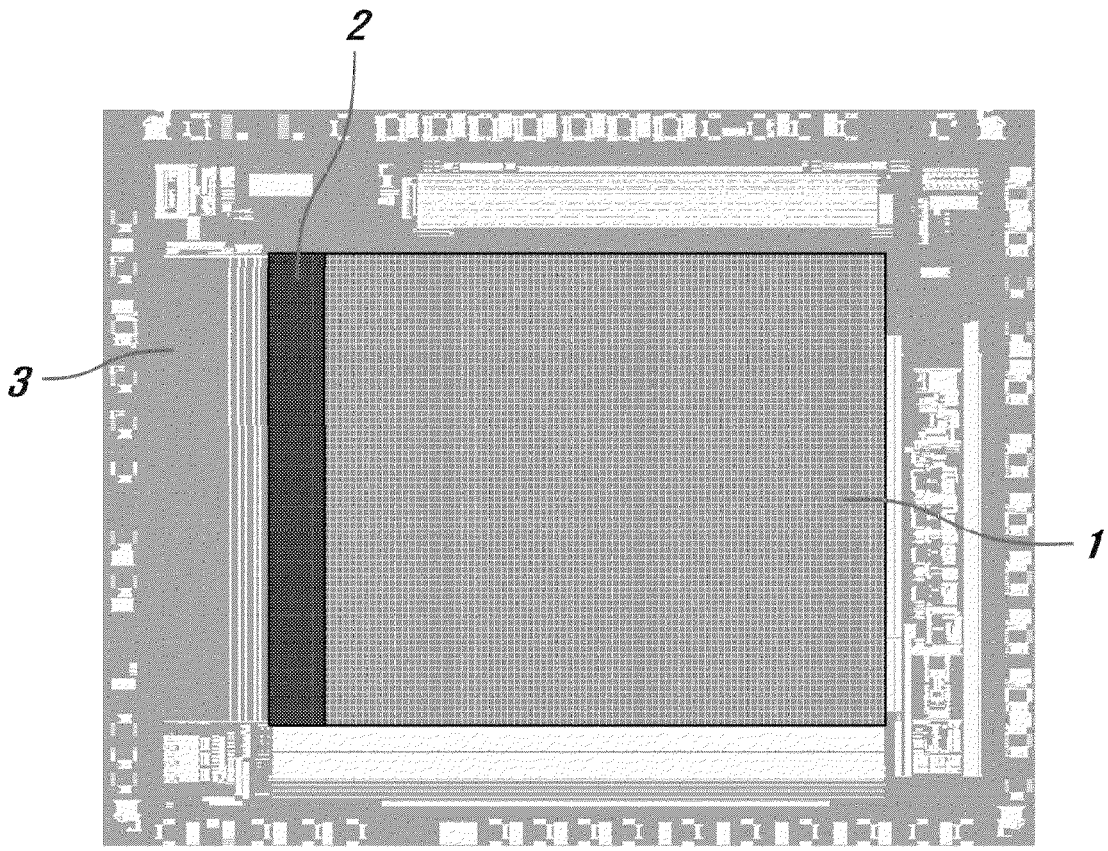
FIG. 1A is a diagram of a CMOS image sensor known in the art.
Figure 1B:
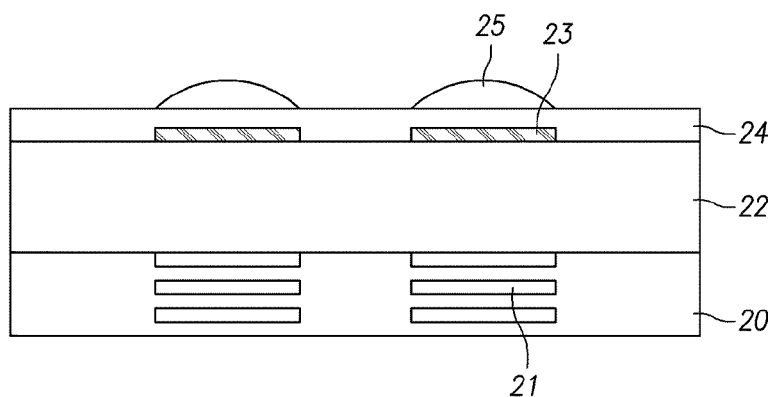
FIG. 1B is a cross-sectional diagram of a dummy pixel area of a CMOS image sensor of the art.
Figure 2:
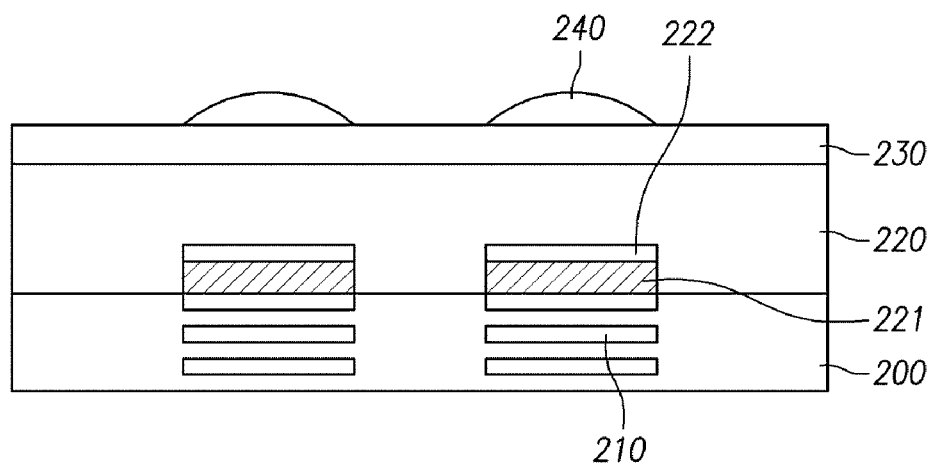
FIG. 2 is a cross-sectional diagram of a dummy pixel area of a CMOS image sensor according to an embodiment of the present invention.

Then, a first photoresist pattern is formed on the polysilicon layer, with an opening over each photodiode 210. An etching process is then carried out using the first photoresist pattern in order to form the polysilicon pattern 221 shown in FIG. 2.

Alternatively, the polysilicon pattern 221 can be formed in various ways using the process used to form the gate electrode in the main pixel area.

Subsequently, the spaces between the respective polysilicon patterns 221 are filled with a second photoresist pattern. Then a metal having a high melting point, such as Co, Ti and the like, is deposited on the silicon epitaxial layer 200 and polysilicon patterns 221 at a substrate temperature of 200° C. with a vacuum degree of 10 Torr.

In the embodiment of the present invention, the dummy pixel area 2 acts as a reference area for enhancing the image characteristics during image signal processing. Thus, the dummy pixel area 2 is formed so as not to be affected by light. Thus, the low reflectivity and low transmissivity of cobalt (Co) is desirable, so cobalt may be used as the high melting point metal. Thus, in a preferred embodiment, cobalt is deposited on the polysilicon pattern 221.

After the cobalt has been deposited on the polysilicon pattern 221, the second photoresist pattern is removed using an ashing process. The cobalt silicide layer 222 is then formed by a rapid annealing process being carried out at between 800 and 1,000° C. in an Ar gas ambience environment for 20 seconds.

Advantageously, the cobalt silicide layer 222 plays the same light shielding role as the dark shield layer, preventing light from being transmitted to the photodiode 210.

After the Co silicide layer 222 has been formed, a device protecting layer 2220 formed of USG (undoped silicate glass) is formed on the silicon epitaxial layer 200 and cobalt silicide layer 222.

If the device protecting layer 220 is formed by coating USG (undoped silicate glass), the device protecting layer 220 in the dummy pixel area has different height than the neighbor areas.

To prevent the difference in heights, a liquid SOG (spin on glass) phase is formed in a planarization process. Then the planarization layer 230 is formed by hardening the coated SOG in an annealing process.

Subsequently, a CMP process is performed on the surface of the semiconductor so as to planarize the surface. A nitride layer (not shown in the drawing) formed of silicon nitride such a SiN is selectively formed on the planarization layer 230. Than, a plurality of microlenses 240 are formed on the nitride layer over the photodiodes 210.

As mentioned in the foregoing description, in the image sensor fabricating method according to the present invention, the polysilicon patterns 221 and the cobalt silicide layer 222 are formed while the gate electrode in the main pixel area is formed without requiring a dark shield layer in the dummy area 2, the reducing the number of processes required to produce the sensor. Because the polysilicon pattern and the silicide are able to cut off light, it is unnecessary to form the dark shield layer. Therefore, the present invention enhances performance of image TOPS.

It will be apparent to those skilled in the art that various modifications and variations can be made in the present invention without departing from the spirit or scope of the invention. Thus, it is intended that the present invention covers any modifications or variations of this invention provided they come within the scope of the appended claims and their equivalents.

What is claimed is:

1. A method of fabricating a CMOS image sensor, the method comprising:
    forming a plurality of polysilicon patterns on a silicon epitaxial layer which correspond to the location of a plurality of photodiodes formed in a dummy pixel area;
    depositing a metal with a high melting point on the a plurality of the polysilicon patterns silicon on the epitaxial layer using a photoresist in an etching process;
    forming a silicide layer of the high melting point metal by removing the photoresist and performing an ashing and rapid annealing process;
    sequentially forming a device protecting layer and a planarization layer on the silicon epitaxial layer and silicide layer; and
    forming a microlens on the planarization layer which corresponds to the location of the silicide layer.

2. The method of claim 1, wherein the metal with the high melting point metal is cobalt.

3. The method of claim 1, wherein the rapid annealing process used to form silicide layer is performed at a temperature of between 800 and 1,000° C. in Ar gas ambience environment for 20 seconds.

4. The method of claim 1, wherein the device protecting layer is formed using an undoped silicate glass.

5. The method of claim 1, wherein the planarization layer is formed using a spin-on-glass.

* * * * *